United States Patent [19]

Ford et al.

[11] Patent Number: 5,373,125
[45] Date of Patent: Dec. 13, 1994

[54] SWITCH ASSEMBLY

[75] Inventors: Robert B. Ford, Tamarac; James V. Pottala, Sunrise, both of Fla.

[73] Assignee: Motorola, Inc., Schaumburg, Ill.

[21] Appl. No.: 35,774

[22] Filed: Mar. 23, 1993

[51] Int. Cl.$^5$ .......................................... H01H 35/14
[52] U.S. Cl. ........................... 200/61.52; 335/205; 455/89
[58] Field of Search ............... 200/61.45 R–61.53, 200/61.45 M; 335/205; 338/32 R, 38 H; 455/89, 90, 899; H01H 35/14

[56] References Cited

U.S. PATENT DOCUMENTS

| | | | |
|---|---|---|---|
| 2,997,557 | 8/1961 | Gillmore et al. | 200/61.45 MX |
| 3,564,496 | 2/1971 | Brooks et al. | 340/440 |
| 3,601,729 | 8/1971 | Hierta | 335/205 |
| 3,737,599 | 6/1973 | Zuvela | 200/61.45 R |
| 3,748,415 | 7/1973 | Suzuki | 200/61.45 M |
| 3,774,128 | 11/1973 | Orlando | 200/61.45 M |
| 3,815,963 | 6/1974 | Wilk | 308/10 |
| 4,450,326 | 5/1984 | Ledger | 200/61.45 M |
| 4,665,385 | 5/1987 | Henderson | 340/539 |
| 4,884,067 | 11/1989 | Nordholm et al. | 340/686 |
| 5,006,676 | 4/1991 | Bogut et al. | 200/61.52 |
| 5,137,033 | 8/1992 | Norton | 128/886 |
| 5,149,926 | 9/1992 | Ono | 200/61.45 M |

FOREIGN PATENT DOCUMENTS 125493A 11/1984 Germany ............... H01H 35/14

OTHER PUBLICATIONS

"Hall Effect and Optoelectronic Sensors"—Sprague Data Book SN-500, 1987, 9 Pages.

Primary Examiner—J. R. Scott
Attorney, Agent, or Firm—Pedro P. Hernandez

[57] ABSTRACT

A tilt switch assembly (100) includes a hall-effect device (102) for determining if a magnet (110) which is placed within a housing (112) has tilted a predetermined amount causing the hall-effect device to actuate. In another embodiment of the invention (300), a movable magnetic filed concentrator (306) which moves in response to switch assembly (300) being tilted causes a tilt condition signal to be generated when the switch assembly (300) is tilted a predetermined amount. In still another embodiment of the present invention, a magnet (502) is stored within a cavity area which allows for the magnet to tilt when the switch assembly (500) is tilted a predetermined amount. Once the magnet (502) becomes tilted, a tilt condition signal is generated.

10 Claims, 4 Drawing Sheets

SWITCH ASSEMBLY

TECHNICAL FIELD

This invention relates in general to switch assemblies, and more specifically to a tilt switch assembly.

BACKGROUND

Conventional tilt switches are usually designed using mercury or other conductive substances. Such tilt switches are typically designed using a metal container with an insulated center post, the metal container being filled with a bubble of mercury. The container and post act as switch terminals and the mercury bubble forms the connection that bridges the switch terminals when the tilt switch is tilted a certain amount.

One problem associated with such mercury switches is that the switches are environmentally unsafe, given that the switches contain mercury. Another problem associated with mercury switches are that they are prone to false switching caused by the mercury inside of the switch sloshing even when the switch has not been tilted by the prescribed amount.

A need thus exists for a tilt switch which can overcome the above cited problems.

DETAILED DESCRIPTION OF THE PREFERRED EMBODIMENT

Figure 1:
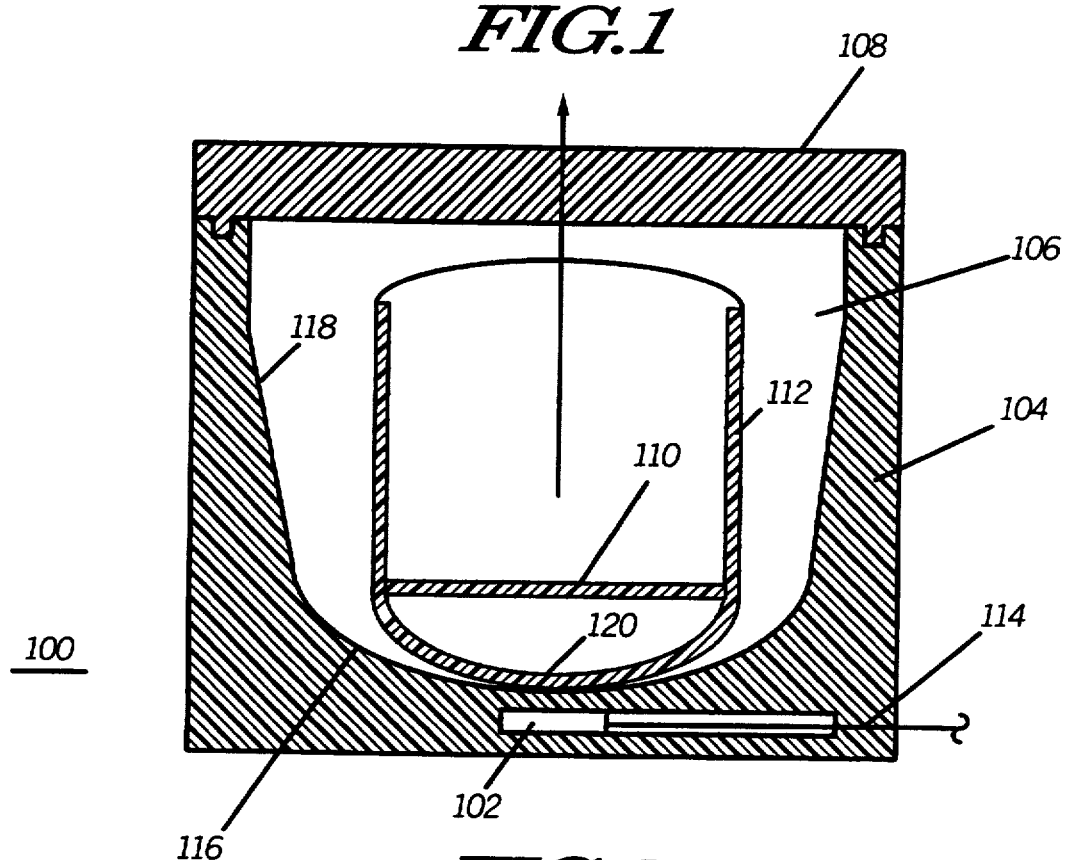
FIG. 1 shows a cross-sectional view of a tilt switch assembly in accordance with the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a cross-sectional view of a tilt switch assembly 100 in accordance with the present invention is shown. Switch assembly 100 includes a first housing member 104. Housing member 104 is preferably made from a non-ferrous material such as plastic, etc. Located in first housing member 104 is a magnetic field detector such as a conventional Hall Effect device (Hall Effect digital switch or sensor) 102 manufactured by Sprague, Inc. Magnetic field detector could also be a reed switch or other similar device which can be activated by a magnetic field, although a Hall Effect is preferred due to its superior magnetic field detection capabilities. Hall Effect switch 102 can be retained in housing 104 by a number of well known retention means or can be overmolded into housing 104. Hall Effect switch 102 includes a plurality of leads which are coupled to electrical bus 114 for providing ground terminal connection, voltage source connection (Vcc), and the Hall Effect device's output terminal line. Bus I 14 is coupled to a sensing circuit such as a microprocessor or discrete hardware which can act on the Hall Effect switch's output signal (tilt condition signal).

Housing 104 includes a cavity area 106 which is formed in housing 104 and defined by inner housing wall 118. Cavity area 118 is dish shaped with housing wall 118 going all around the cavity. Housing wall 118 is tapered a predetermined amount all around the periphery of cavity area 106. The inner wall 118 which defines cavity area 106 is designed so that pivotal housing member 112 which contains a magnetic field source such as permanent magnet 110, when oriented in the upright orientation (reference arrow pointing vertically), is in-line with sensor 102 at a spacing that causes the sensor to switch "ON" (or "OFF" depending on the circuit design implemented). When tilt switch assembly 100 is tilted a predetermined amount (e.g., 45 degrees) housing 112 pivots causing the magnetic field generated by magnet 110 to change orientation. Also, the spacing between magnet 110 and sensor 102 is increased. This causes sensor 102 to switch "OFF" since the magnetic field present at the face of the Hall Effect device is decreased. The particular geometry's of housing 112, the size and strength of magnet 110 and the sensing capability of sensor 102, etc. will determine how much tilting of assembly 100 is required to trigger sensor 102. Pivotal housing 112 acts as a magnetic field directing means which directs the magnetic field developed by magnet 110 by an amount which corresponds to how much housing 104 is being tilted. At a predetermined pivot angle (trip point), switch assembly will cause a trip (tilt) condition to occur. Pivotal housing member 112 can be cup-shaped with a curved bottom surface 120 and a hollow top for allowing magnet 110, which is preferably cylindrical in shape, to fit inside of the opening a predetermined distance from sensor 102.

Switch assembly 100 also includes a housing cover 108 which is fastened to housing 104. Preferably, housing cover 108 can be snapped into housing 104. In a radio communication application such as a "man-down" implementation, housing 104 can be part of the radio housing or part of an accessory housing which is attached to the communication device. Cavity 106 and pivotal housing 112 are designed such that pivotal housing 112 can not become stuck or turned up-side down, causing the switch assembly to become inoperable. The height of cavity 106 and the height of the walls forming pivotal housing 112 are selected so that pivotal housing 112 can not be turned over completely even when housing 104 is flipped 180 degrees.

Another approach to the present invention can use a cylindrical magnet in place of pivotal housing 112. The cylindrical magnet would have a predetermined height which would allow it to tilt against side wall 118 and not be able to flip over. If a cylindrical magnet is used by itself without a housing (see FIG. 5), or with a housing similar to pivotal housing 112 except having a flat bottom surface, a more digital on/off trip point switch can be designed. In other words, by using a cylindrical magnet having a flat bottom surface and having the bottom surface 116 also be flat, the magnet will only trip after the assembly has shifted off vertical by a predetermined amount. Unlike, the assembly shown in FIG. 1 which allows for housing 112 to be pivoting with any changes off of vertical. The angle of cavity wall 118 will determine how much return to vertical assembly 100 must be experienced before the magnet becomes returns to it's untilted condition.

Figure 2:
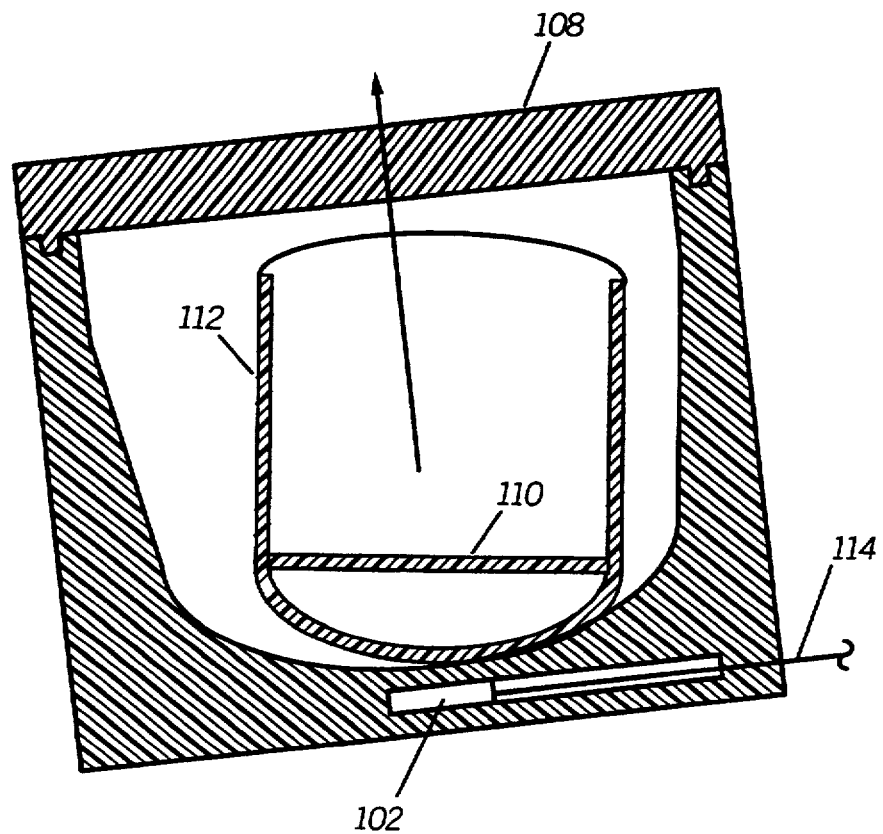
FIG. 2 shows the tilt switch assembly of FIG. 1 shown in a tilted condition.

In FIG. 2, switch assembly 100 of FIG. 1 is shown in the tilted condition. Once sensor 102 determines that a tilt condition has occurred (the magnetic field being received at sensor 102 is lowered than the threshold level), a tilt condition signal generated by sensor 102 is sent via bus 114. Bus 114 can be connected to a controller such as a microprocessor or other device so that the tilt condition signal can be acted on. In the case of a communication device such as a radio, the tilt condition signal can inform the radio's controller to initiate an emergency message condition.

Figure 3:
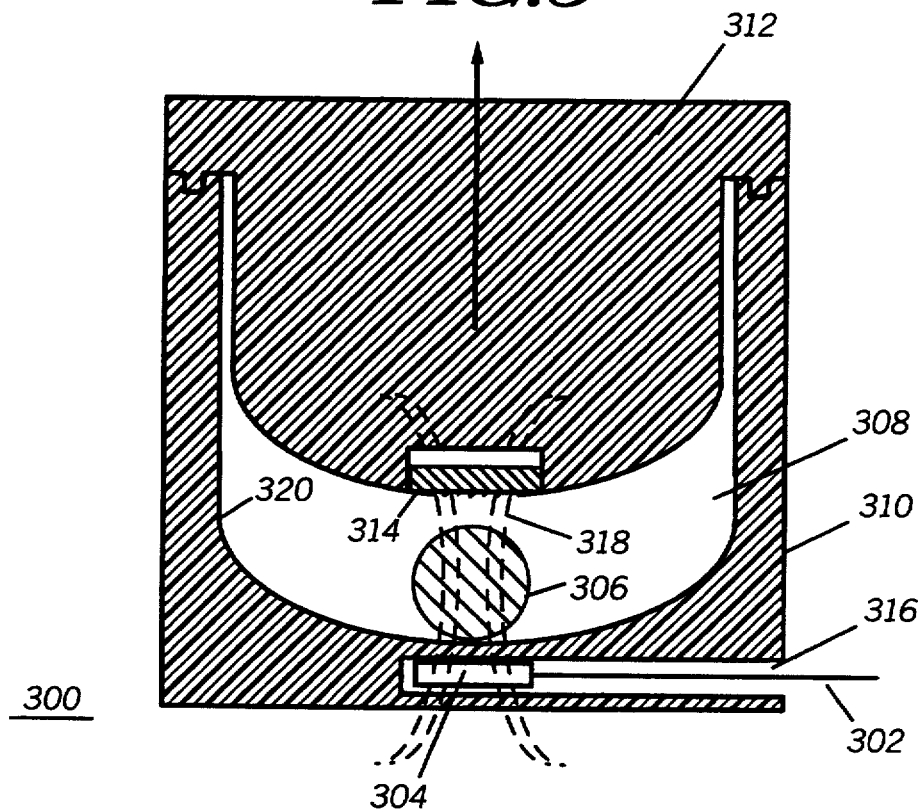
FIG. 3 is a cross-sectional view of another embodiment of a tilt switch assembly in accordance with the present invention.

In FIG. 3, a second embodiment of the invention is shown. In this second embodiment, magnet 314 is fixed unlike the pivotal magnet arrangement of FIGS. 1-2. Magnet 314 is retained by housing cover 312. Housing 310 includes a cavity for allowing sensor 304 to reside in a fixed location with its magnetic field sensing area facing magnet 314. In this embodiment, the spacing between magnet 314 and sensor 304 and the magnetic strength of magnet 314 are such that the magnetic field is not strong enough to trigger sensor 304 without the help of a magnetic field concentrator 306. Magnetic field concentrator 306 acts as a magnetic field directing means and is preferably a spherical metal member which helps concentrate (direct) the magnetic flux towards sensor 304. Concentrator 306 can be formed from a number of metals and alloys such as iron, low carbon (cold-rolled) steel, etc. If assembly 300 is tilted off vertical by a predetermined amount, concentrator 306 will roll toward wall 320 which defines cavity area 308, thereby reducing the amount of the magnetic field (magnetic flux) 318 which reaches sensor 304.

Figure 4:
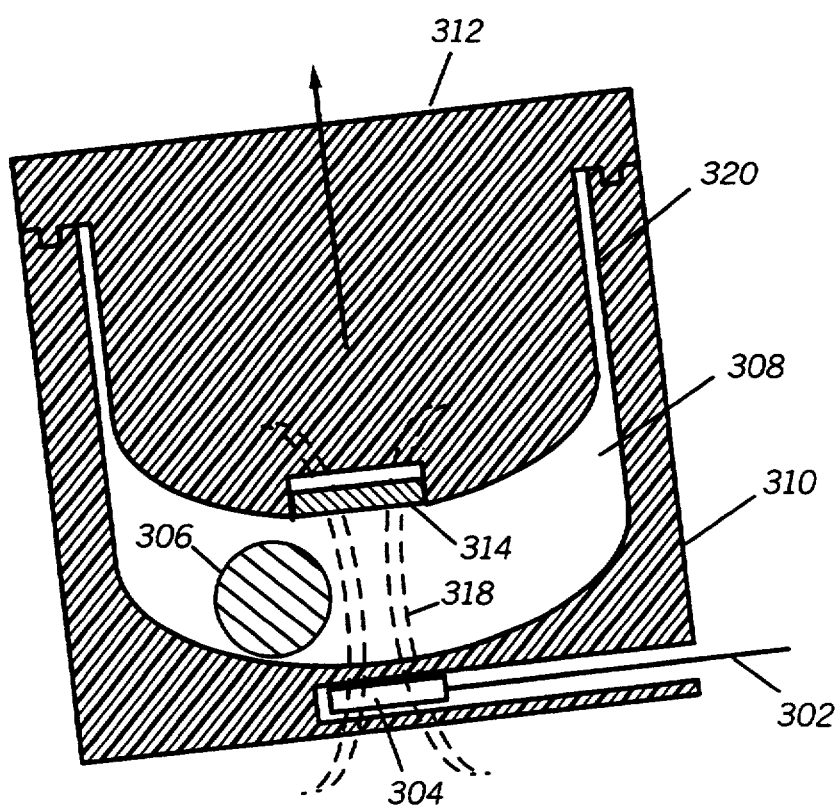
FIG. 4 shows the tilt switch assembly of FIG. 3 in a tilted condition.

In FIG. 4, assembly 300 is shown in the tilted condition. As shown, magnetic field 318 becomes less concentrated causing sensor 304 to generate a tilt condition signal which is sent via bus 302. The angle of wall 320 which forms dished cavity area 308, the size and characteristics of concentrator 306, type of sensor 304, and size and strength of magnet 314 will determine how much tilting is required to activate sensor 304. The switch assembly 300 can be designed so that sensor 304 triggers (outputs the tilt condition signal) upon assembly 300 being tilted by a predetermined amount, for example, 30 degrees off vertical.

Figure 5:
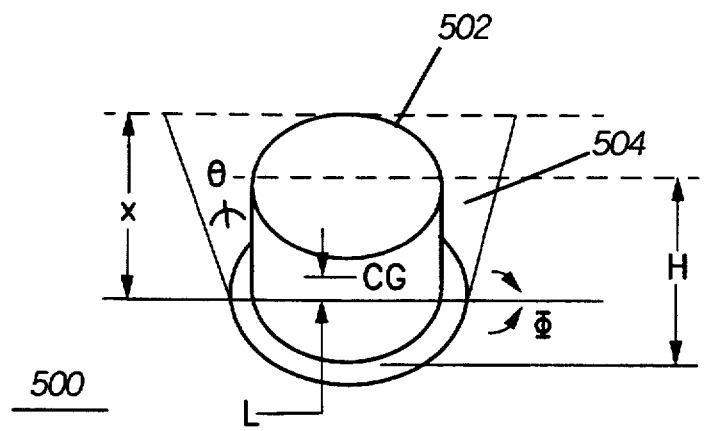
FIG. 5 shows a partial section of a tilt switch assembly in accordance with the present invention.
Figure 6:
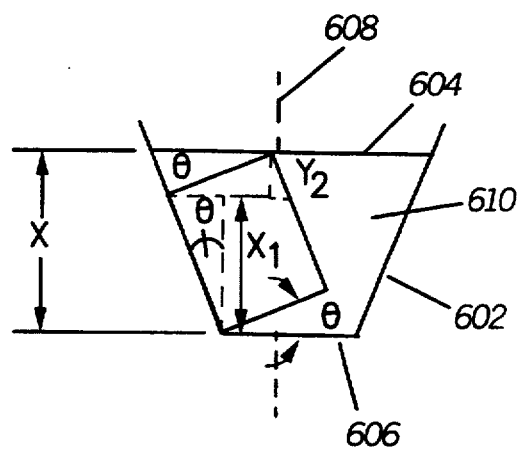
FIG. 6 shows a partial section of a tilt switch assembly with the magnet in a tilted condition.

In FIG. 5 and 6, a few of the dimensions that need to be determined when designing the tilt switch assembly are shown. In these figures, magnet 502 is a cylindrical permanent magnet which is tall enough so that a pivotal housing unit (such as housing 112 in FIG. 1) is not required. Both magnet end surface 612 and the floor of the cavity area 606 have substantially flat surfaces. Magnet 502 is tiltably located (magnet 502 is capable of tilting against the cavity area's walls and capable of returning to its original upright position) inside of cavity area 504.

Although the same equations can be used to determine the proper dimensions for an arrangement as shown in FIGS. 1-2.

A tilt condition will occur when:

$$TAN \Phi = \frac{r}{L}$$

where $\Phi$=tilt angle, r is equal to the radius of magnet 502 or pivotal housing, and where L is the distance from the bottom of the magnet to the magnet's center of gravity (or the center of gravity of housing with magnet).

In a typical example, if we want the tilt angle to be 60 degrees or greater, we begin by assuming the base radius of magnet 502. If we assume that the base radius of magnet 502 is equal to 0.125 inch, then the distance to the center of gravity 'L" must equal 0.072 inch. In this particular example, it is also desired that the tilt condition signal remain active until the switch assembly is uprighted to an angle of 40 degrees or less from vertical, If we continue the analysis with reference now to FIG. 6, we can calculate the distance "X" from the top cover 604 to floor 606 of housing 602 in the above example. Since we know that the top to bottom distance is equal to:

$$X = x_1 + x_2$$

and, $$\cos \theta = \frac{x_1}{H}, \text{ and}$$

$$\sin \theta = \frac{x_2}{D}.$$

Assuming the height of magnet or pivotal housing which ever design is used is equal to 0.144 inch (in this particular example we will assume the magnetic material is isentropic such that the center of gravity of the magnet is located halfway along its height) and the desired hysteresis must equal to 20 degrees ($\theta = 20°$), then the top to bottom distance "X" of cavity 504 is equal to 0.221 inch. Line 608 shows the axis of symmetry for the cavity area 610.

Figure 9:
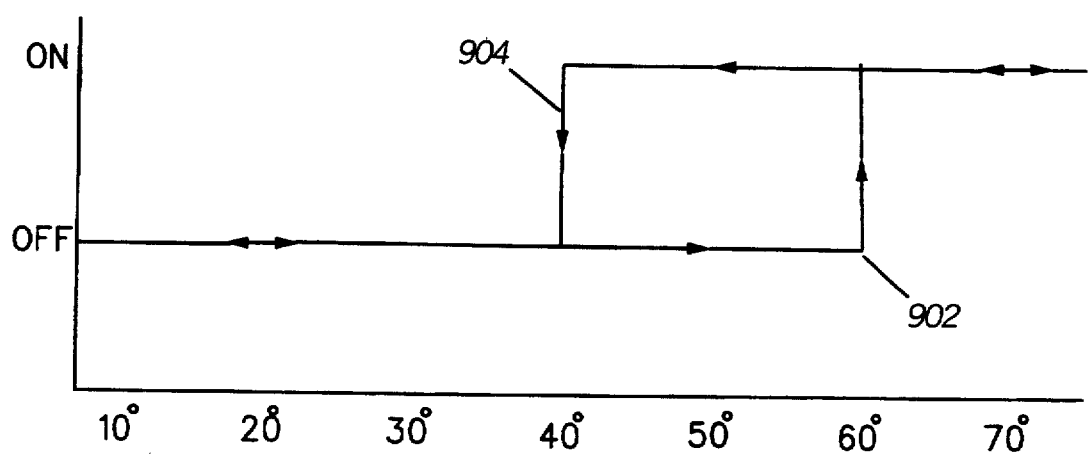
FIG. 9 shows a graphical representation of the typical mechanical operation for a tilt switch assembly in accordance with the present invention.

In FIG. 9, a graphical representation of the above mentioned example is shown. As shown in the graph, the tilt condition 902 occurs at 60 degrees (housing assembly is tilted 60 degrees). Given that the cavity wall angle is set at 20 degrees from the cavity wall to the axis of symmetry of the cavity area (110 degrees measured from the floor of the cavity area to the cavity wall), the magnet will upright at 40 degrees from vertical. By controlling the wall angle, the amount of hysteris is exhibited by the switch assembly can be controlled.

Figure 7:
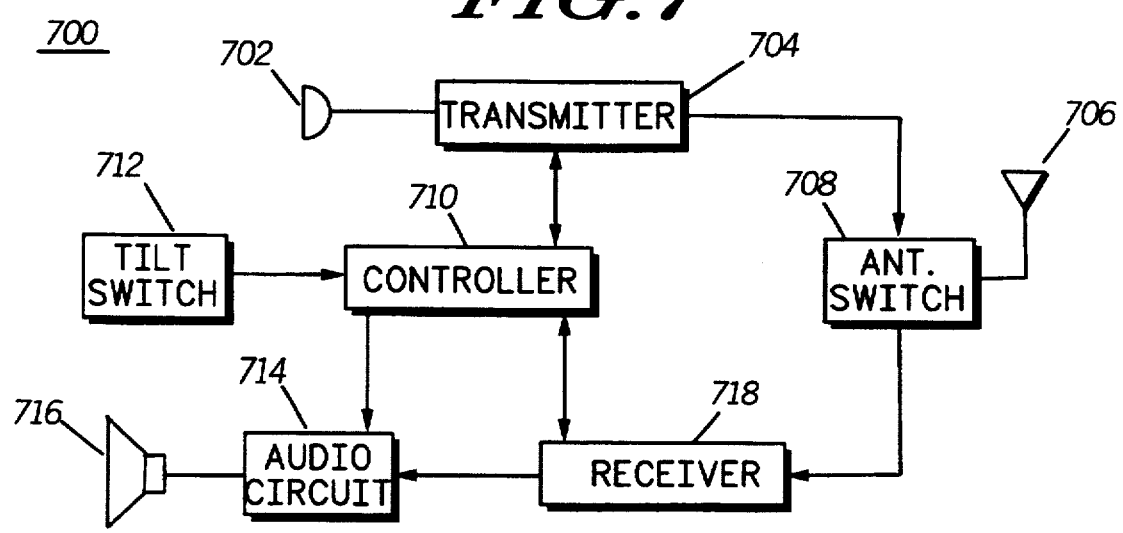
FIG. 7 shows a block diagram of a communication device utilizing the present invention.

Referring now to FIG. 7, a block diagram of a communication device such as a two-way radio 700 utilizing the present invention is shown. The communication device comprises conventional transmitter 704 and receiver 718 sections which are controlled by a controller 710. Controller 710 can be anyone of a number of microprocessors or microcontrollers such as a MC68HC11 manufactured by Motorola, Inc. Controller 710 controls the overall operation of communication device 700. A microphone 702 is coupled to transmitter 704 for receiving voice messages and convening them into electrical signals which are used by transmitter 704. A speaker 716 is coupled to receiver 718 via audio amplifier 714 for presentation of audio messages to the user. Antenna switch 708 which is under the control of controller 710 selectively switches transmitter 704 and receiver 718 to antenna 706. Also, coupled to controller 710 is a tilt switch assembly 712 similar to the switch assembly discussed in FIG. 1. Whenever communication device 700 is tilted a predetermined amount, switch circuit 712 generates a tilt condition signal which is received by controller 710 via one of it's I/O ports. Upon receiving the tilt condition signal, controller 710 can initiate an emergency signal transmission via transmitter 704. Controller 710 can also not initiate an emergency signal transmission unless the tilt condition signal is present for a predetermined period of time (e.g., 10 seconds, etc.). This would help prevent sending an emergency condition if the person wearing communication device 700 had bent over to pick up something or had tilted the communication in some other fashion.

Controller 710 can also in addition to the emergency signal transmission initiate a local tilt condition alert signal sequence via speaker 716 which can help locate the person who has fallen. For example, a fireman wearing communication device 700 if he becomes incapacitated and falls would initiate an emergency signal transmission which would be received by another communication device, as well a local alarm sequence would be initiated which would help those attempting a rescue to locate the fallen fireman.

Figure 8:
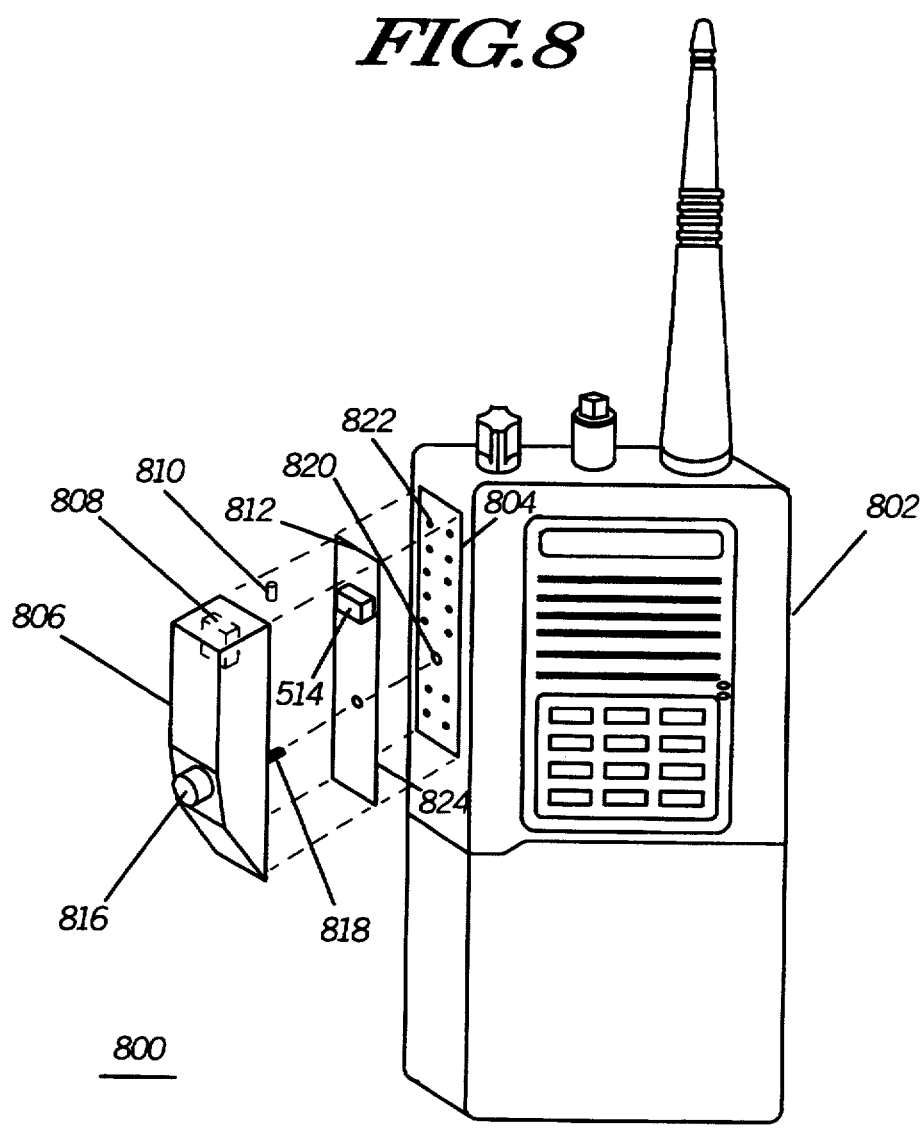
FIG. 8 shows an exploded view of a communication device in accordance with the present invention.

In FIG. 8, a communication device 800 in accordance with the invention is shown. Communication device 800 includes a conventional transceiver portion 802 having an external accessory connector 804. Accessory connector 804 includes a plurality of input/output (I/O) contacts 822 for coupling to external devices. Accessory connector 804 also includes a threaded receiving portion which allows for the coupling of the external accessory to the main transceiver section 802. In the preferred embodiment, the external accessory is a removable tilt switch assembly in accordance with the invention. The tilt switch assembly includes a first housing 806 which contains a cavity area 808 for receiving magnet 810. A printed circuit board 812 which includes a Hall Effect device 814 is attached to housing 806. On the other side of circuit board 812 are a plurality of contacts 824 which mate to the contacts 822 and provide a supply voltage line, ground potential line and a tilt condition line to the external switch assembly.

Housing 806 includes a captivated screw 816 having a threaded end portion 818 which threads into threaded area 820. Once attached, whenever communication device 800 is tilted a predetermined amount (e.g., 45 degrees from vertical) the tilt switch assembly generates a tilt condition signal which is sent to the communication device's controller. In response to the tilt condition an emergency signal such as a conventional "man-down" signal can be transmitted alerting the receiving party that the person wearing communication device 800 has fallen. Such a tilt switch assembly can be used by prison guards or people which are in high risk of being injured on the job.

In summary, the present invention provides for an improved tilt switch assembly which is less prone to false switching as the old mercury switches and is also simple and economical to assemble. All the members which form the present invention can be designed so that they can be snapped together in a short period of time. The present invention can also be designed so that it can be a removed from the communication device as shown in FIG. 8, or it can be designed so that it is part of the communication device housing.

What is claimed is:

1. A tilt switch assembly, comprising:
a housing member having an outer wall;
a magnetic field source which generates a magnetic field attached to the housing member;
a tilt switch housing having a cavity area defined by a floor and an inner wall having a predetermined wall angle relative to the floor, the housing member located inside of the housing cavity area and resting on top of the cavity floor: and
a magnetic field detector located within the tilt switch housing and underneath the floor of the cavity area, the magnetic field detector is responsive to the magnetic field for providing a tilt condition signal when the housing member outer wall tilts a predetermined amount towards the cavity walls causing the magnetic field to change orientation away from the magnetic field detector.

2. A tilt switch assembly as defined in claim 1, wherein the magnetic field source comprises a cylindrical shaped permanent magnet.

3. A tilt switch assembly as defined in claim 2, wherein the magnetic field detector comprises a Hall Effect device.

4. A communication device, comprising:
a radio frequency transmitter; and
a tilt switch coupled to the radio frequency transmitter, comprising:
a housing member having an outer wall:
a magnetic field source which generates a magnetic field attached to the pivotal housing member;
a tilt switch housing having a cavity area defined by a floor and an inner wall having a predetermined wall angle relative to the floor, the housing member located inside of the housing cavity area and resting on top of the cavity floor;
a magnetic field detector located within the housing and underneath the floor of the cavity area, the magnetic field detector is responsive to the magnetic field and provides a tilt condition signal to the radio frequency transmitter when the housing member outer wall tilts a predetermined amount towards the cavity walls causing the magnetic field generated by the magnetic field source to change orientation away from the, magnetic field detector.

5. A communication device as defined in claim 4, wherein:
the radio frequency transmitter transmits an emergency message in response to it receiving the tilt condition signal from the magnetic field detector.

6. A communication device as defined in claim 5, wherein the magnetic field source comprises a permanent magnet and the magnetic field detector comprises a Hall Effect device.

7. A tilt switch, comprising:
a housing;
a magnetic field source which generates a magnetic field attached to the housing;
a magnetic field detector located within the housing and spaced away from the magnetic field source;
the housing including a cavity area located between the magnetic field source and the magnetic field detector;
a magnetic field concentrator located within the cavity area, the magnetic field concentrator moves within the cavity area in response to the tilting of the housing, the magnetic field concentrator directs the magnetic field provided by the magnetic field source to the magnetic field detector when the housing is not tilted and stops directing the magnetic field to the magnetic field detector when the housing is tilted a predetermined amount; and the magnetic field detector provides a tilt condition signal when the magnetic field concentrator fails to direct the magnetic field to the magnetic field.

8. A tilt switch as defined in claim 7, wherein the magnetic field concentrator comprises a spherical metal member.

9. A tilt switch as defined in claim 8, wherein the magnetic field source comprises a permanent magnet and the magnetic field detector comprises a Hall Effect device.

10. A tilt switch as defined in claim 9, wherein the housing cavity area has a curved floor which helps retain the spherical metal member in substantial alignment between the permanent magnet and the Hall Effect device until the housing is tilted a predetermined amount.

* * * * *